United States Patent
Piels et al.

(10) Patent No.: US 11,243,230 B2
(45) Date of Patent: Feb. 8, 2022

(54) COMPACT OPTO-ELECTRIC PROBE

(71) Applicant: Juniper Networks, Inc., Sunnyvale, CA (US)

(72) Inventors: Molly Piels, Santa Barbara, CA (US); Anand Ramaswamy, Pasadena, CA (US); Brandon Gomez, Goleta, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

(21) Appl. No.: 16/730,338

(22) Filed: Dec. 30, 2019

(65) Prior Publication Data

US 2021/0199691 A1 Jul. 1, 2021

(51) Int. Cl.
*G01R 1/067* (2006.01)
*G01R 31/3185* (2006.01)
*G01R 31/308* (2006.01)

(52) U.S. Cl.
CPC ...... *G01R 1/067* (2013.01); *G01R 31/318511* (2013.01); *G01R 31/308* (2013.01)

(58) Field of Classification Search
CPC ............ G01R 1/067; G01R 31/318511; G01R 31/308; G01R 31/2889; G01R 31/311; G01R 31/3025; G01R 1/0735; G01R 31/31728; G01R 31/31905; G01R 31/2851; G01R 31/2886; G01R 3/00; G01R 15/22; G01R 1/071; G01R 1/07378; G01R 31/2887; G01R 31/31917; G01R 31/2656; G02B 6/4214; G02B 6/12004; G02B 6/4206; G02B 6/43; G02B 6/12019
See application file for complete search history.

(56) References Cited

U.S. PATENT DOCUMENTS

| | | | | |
|---|---|---|---|---|
| 4,912,399 A | * | 3/1990 | Greub | G01R 1/0735 324/755.09 |
| 5,583,445 A | * | 12/1996 | Mullen | G01R 31/311 324/754.23 |

(Continued)

FOREIGN PATENT DOCUMENTS

| | | |
|---|---|---|
| CN | 113125935 A | 7/2021 |
| JP | H05121508 | 5/1993 |

(Continued)

OTHER PUBLICATIONS

"European Application Serial No. 20165280.7, Extended European Search Report dated Aug. 28, 2020", 10 pgs.

(Continued)

*Primary Examiner* — Lee E Rodak
(74) *Attorney, Agent, or Firm* — Schwegman Lundberg & Woessner, P.A.

(57) ABSTRACT

Described are various configurations for performing efficient optical and electrical testing of an opto-electrical device using a compact opto-electrical probe. The compact opto-electrical probe can include electrical contacts arranged for a given electrical contact layout of the opto-electrical device, and optical interface with a window in a probe core that transmits light from the opto-electrical device. An adjustable optical coupler of the probe can be mechanically positioned to receive light from the device's emitter to perform simultaneous optical and electrical analysis of the device.

20 Claims, 9 Drawing Sheets

(56) References Cited

U.S. PATENT DOCUMENTS

| | | | | |
|---|---|---|---|---|
| 5,631,571 | A * | 5/1997 | Spaziani | G01R 1/071 324/658 |
| 6,859,031 | B2 * | 2/2005 | Pakdaman | G01R 31/311 324/233 |
| 2005/0194990 | A1 * | 9/2005 | Gothoskar | G02B 6/30 324/754.23 |
| 2006/0040417 | A1 | 2/2006 | Eldridge et al. | |
| 2006/0109015 | A1 * | 5/2006 | Thacker | G02B 6/12004 324/755.07 |
| 2007/0132467 | A1 * | 6/2007 | Jager | G01R 31/311 324/754.07 |
| 2011/0279812 | A1 * | 11/2011 | Masuda | G01R 31/2886 356/123 |
| 2012/0286817 | A1 * | 11/2012 | Duckworth | G01R 1/06738 324/755.01 |
| 2013/0001405 | A1 * | 1/2013 | Walker | G01J 1/0451 250/208.2 |
| 2017/0160482 | A1 * | 6/2017 | Frankel | G02B 6/30 |
| 2019/0056458 | A1 | 2/2019 | Arai | |
| 2020/0049737 | A1 * | 2/2020 | Wang | G01R 1/071 |
| 2020/0378865 | A1 * | 12/2020 | Gnausch | H04B 10/803 |
| 2021/0055340 | A1 * | 2/2021 | Hsu | G01R 31/2601 |

FOREIGN PATENT DOCUMENTS

| | | |
|---|---|---|
| KR | 20160084014 | 7/2016 |
| KR | 20180037509 A | 4/2018 |
| TW | 202125661 A | 7/2021 |
| WO | 2019197320 | 10/2019 |

OTHER PUBLICATIONS

"Taiwanese Application Serial No. 109106200, Office Action dated Apr. 27, 2021", w o English Translation, 7 pgs.

"Korean Application Serial No. 10-2021-0111519, Notice of Preliminary Rejection dated Oct. 29, 2021", w English translation, 8 pgs.

"Taiwanese Application Serial No. 109106200, First Office Action dated Nov. 11, 2021", w o English translation, 8 pgs.

* cited by examiner

COMPACT OPTO-ELECTRIC PROBE

TECHNICAL FIELD

The present disclosure generally relates to circuit interfaces, and more particularly to optical and electrical interface systems.

BACKGROUND

In semiconductor fabrication, wafer testing of semiconductor devices occurs before the wafer is singulated into multiple dies (e.g., diced or separated into chips). Testing equipment can interface with the wafer using a wafer probe to test the wafer components (e.g., different circuits or patterns on the wafer). Some wafers can include optical components (e.g., light emitters, photonic circuits) and electrical components that are designed to work simultaneously in production (e.g., after singulation and integration into products). Wafer level testing of a hybrid optical and electrical wafer is difficult due to the large size of the test equipment and the compact size of modern high-speed opto-electric devices.

BRIEF DESCRIPTION OF THE DRAWINGS

To easily identify the discussion of any particular element or act, the most significant digit or digits in a reference number refer to the figure ("FIG.") number in which that element or act is first introduced.

DETAILED DESCRIPTION

Figure 1:
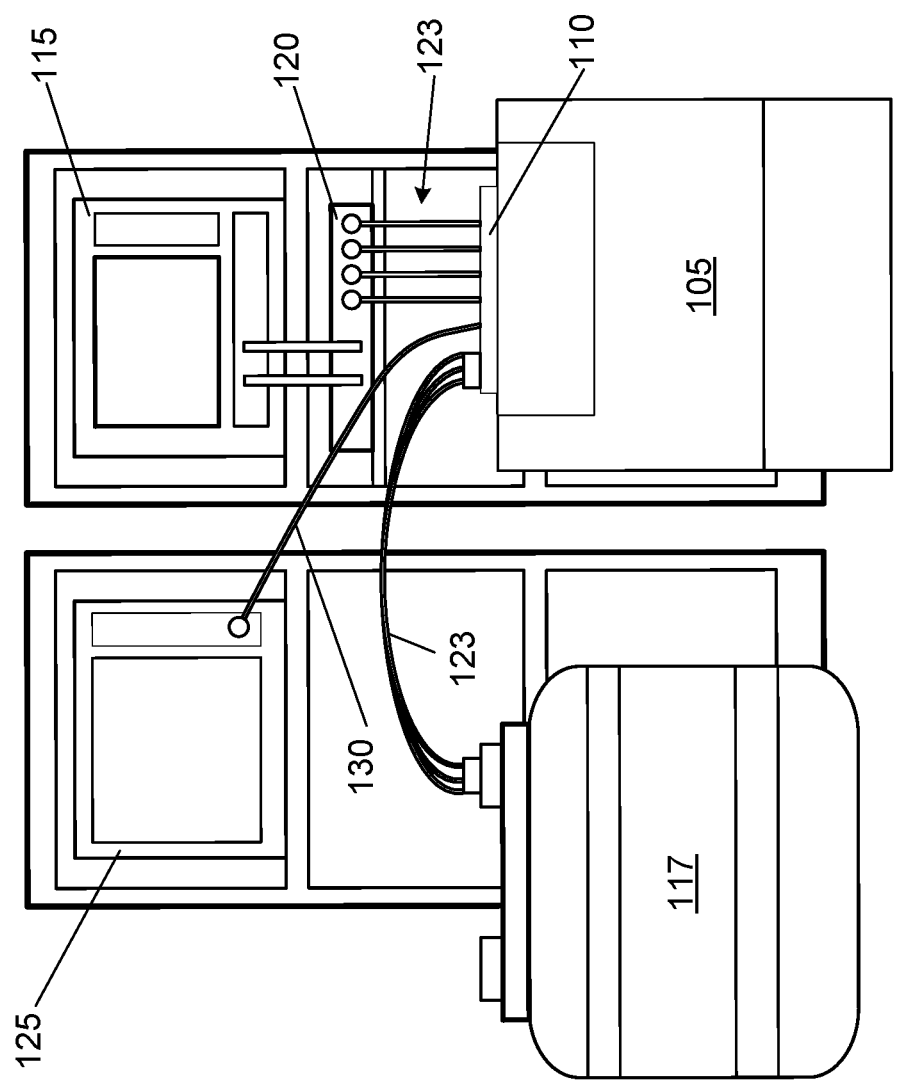
FIG. 1 shows an example opto-electrical probe system for implementing simultaneous wafer-level opto-electrical probing, according to some example embodiments.

The description that follows includes systems, methods, techniques, and instruction sequences that embody illustrative embodiments of the disclosure. In the following description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

In wafer-scale testing of photonic devices, the device under test (DUT) can include an optical interface (e.g., a light emitting diode, laser) and an electrical interface (e.g., electrical paths, contacts, pads), and connections to both types of interfaces are implemented to perform the testing and analysis of the DUT. Conventionally, separate mechanical assemblies are used for the electrical and optical connections (e.g., an electrical testing unit, and a separate optical testing unit) due to the different alignment tolerances and mechanical properties of different types of signals. The separate mechanical assemblies, one for electrical and the other for optical, limit the minimum distance between the electrical contacts and the optical input/output (I/O) ports for the device under test. This testing distance limitation exceeds the minimum feasible size for the device under test, which can have closely spaced optical and electrical connections. One approach is to first test one type of contact (e.g., electrical) followed by the other contacts (e.g., optical) using the separate test apparatuses in turn. However, this approach is inefficient. Simultaneous testing may occur after singulation, however diagnosing issues earlier, at the wafer-level, is preferable.

Alternatively, a hole can be drilled into the probe head to enable light to pass for the optical interface. However, drilling a hole limits the alignment tolerance to the alignment tolerance of hole drilling, which may not be congruent for compact opto-electrical designs having closely spaced traces and optical I/Os. Additionally, hole drilling approaches are not suitable for high-speed probe testing (e.g., radio frequency chips with MHz signal frequencies) due to interference and antenna side effects.

Alternatively, the distances between the electrical and optical contacts in a given opto-electric layout design can be enlarged to allow for the large optical mechanical assembly and the large electrical assembly to interface with the device under test. However, increasing the size creates a larger resulting chip size and is not suitable for compact opto-electrical designs, e.g., increasing the chip size limits device compactness, increase chip/die costs.

To this end, a compact adjustable opto-electrical probe comprises both electrical and optical interfaces in and out of a single probe module. In some example embodiments, light couples out of the device under test (e.g., wafer, chip) via an optical coupler on the surface of the device under test. The beam traverses a membrane and plunger of the probe core and is then coupled into an adjustable coupler (e.g., flexible optical fiber). The adjustable coupler is mounted or nearby (proximate) the input/output light path emanating via the membrane and plunger. The probe module can include a probe frame having a mounting arrangement, e.g., screw holes which can be used to mount a fiber mount assembly, such as an actuator with a hinged fiber arm.

In some example embodiments, electrical contacts (e.g., pins, bumps, or the like) of the probe core are first aligned with the electrical contacts of the device under test. After the electrical contacts are aligned and in contact with the electrical contacts of the device under test, the fiber is mechanically aligned over the optical coupler using actuators in an active alignment approach, according to some example embodiments. In other example embodiments, after electrical interface alignment, no optical alignment need occur (e.g., passive optical alignment) and the fiber is assumed to receive the light from the optical interface. For example, if a device under test can accommodate high enough losses, the fiber can be pre-set and unchecked/ unaligned and it is assumed that some or all of the beam will reach the pre-set fiber once the electrical contacts are aligned.

In some example embodiments, the optical coupler that routes light from the DUT can be an optical grating that emits/receives the light at an angle or normal to the surface of the DUT. In some example embodiments, the optical coupler is integrated into the DUT (e.g., the DUT has a light-emitting diode (LED) with an integrated grating positioned over the LED that emits light at an angle or normal to the surface). In some example embodiments, the probe module includes an optical coupler which is placed proximate (e.g., near, over, or in contact with) the optical output of the DUT. For example, the DUT can include an LED that emits into free space and, in testing, the DUT has a grating coupler that is placed near or in contact with the free space LED emitter of the DUT to route light through an optical window in the plunger and membrane to the fiber coupler.

In some example embodiments, electrically, the DUT is contacted by probe tips that are embedded in the probe core (e.g., membrane and plunger), and the probe tips are connected to routing out to a probe card printed-circuit board (PCB). The membrane and plunger transmit light (e.g., semitransparent, transparent), and the probe frame is open over the device being tested. Further, the electrical routing, components, pads, and/or traces avoid an optical hole (e.g., an optical keep-out area, over which the grating directs the light) to ensure that the light traversing the probe unit is not affected (e.g., blocked, partially blocked). In this way, the only spacing requirement for the optical and electrical I/Os is that of the electrical design (e.g., traces, pads), which can be designed very closely together.

FIG. 1 shows an example opto-electrical probe system 100 for implementing simultaneous opto-electrical probing, according to some example embodiments. As illustrated, a probe platform 105 supports a probe module 110 (e.g., probe core, PCB/stiffener, fiber and positioner), which can include for example, the device under test situated under a probe card. The device under test (not illustrated in FIG. 1) includes electrical contacts that are connected to one or more electrical testing and analysis apparatuses via wires 123 (e.g., electrical cables). For example, in FIG. 1, electrical contacts of the device under test are connected to electrical test apparatuses, such as a vector network analyzer 115 (VNA) by way of a switch 120 (e.g., a 1×N radio frequency (RF) switch), and further electrical contacts of the device under test are connected to an circuit analyzer 117 (e.g., system on chip/integrated circuit (SoC/IC) testing system, such as an Advantest 93k CTH testing system). The device under test can further include an optical interface (e.g., light emitter, laser, LED, photodiode) to transmit and receive optical data.

The optical components of the device under test are analyzed by an optical test apparatus 125, such as an optical spectrum analyzer (OSA). The optical analyzer system 125 interfaces with the optical interface of the device under test via fiber 130 which can receive the light from the device under test via the plunger and membrane (e.g., optical keep-out area in the membrane) of the probe core, where the fiber is moveable via a positioner, as discussed in further detail below.

Figure 2:
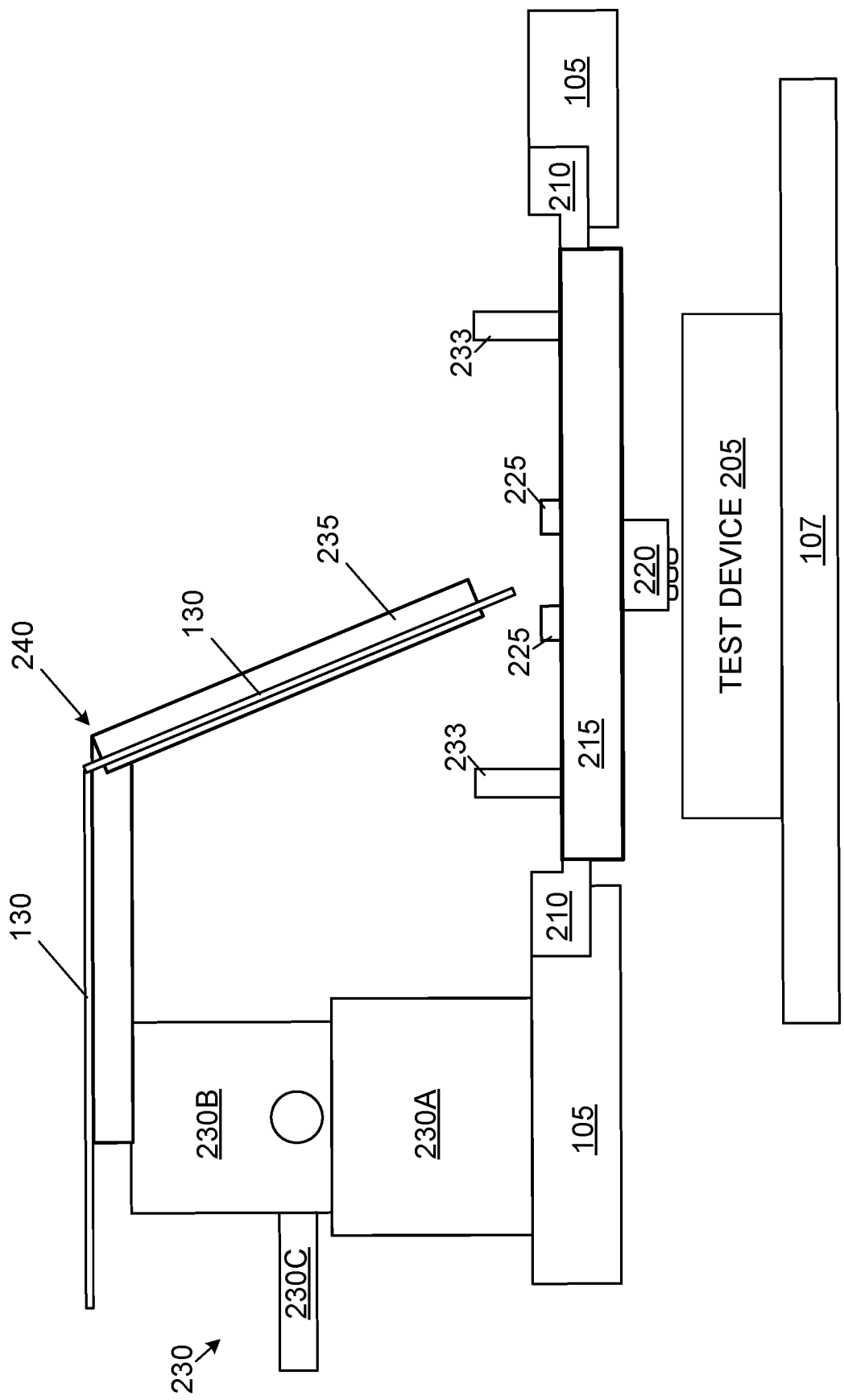
FIG. 2 shows components in the opto-electrical probe system, according to some example embodiments.

FIG. 2 shows components 200 in the opto-electrical probe system 100, according to some example embodiments. In FIG. 2, a test device 205 is an opto-electric device with a photonic integrated circuit (PIC) with electrical contacts of an electrical layer and an optical I/O, where the electrical interface and the optical interface are on a top-level wafer of the test device 205. The test device 205 is placed on the platform 107 (e.g., part of probe platform 105) and the components of the system 100 are positioned over the test device 205 so that the electrical contacts can be aligned and electrically coupled, according to some example embodiments. In some example embodiments, the test device 205 is moved via the platform 107 to align electrical contacts, while in other example embodiments, the test device 205 remains stationary and the probe core 220 is moved into position to interface the test device 205.

In the illustrated embodiment of FIG. 2, the probe platform 105 includes a ring insert 210 (e.g., Advantest 93k hold-down ring) that holds a printed circuit board, PCB 215 which can hold a probe core 220 which can interface with both the electrical and optical interface of the test device 205. Additional support structures include PCB stiffener 233 which provide further support to the PCB 215 and probe core 220 during installation, alignment, and testing.

In some example embodiments, a probe core 220 is a custom circuit component (e.g., FormFactor probe core) mounted into the probe PCB 215 using probe frame 225, e.g., screw in mounts that hold the core 220 to the PCB 215. For example, a given test device may have a certain configuration of electrical contacts/circuitry and optical interface and a custom probe core can be created with pins and optical keep-outs that align with the given test device's optical I/O's. Likewise, additional custom probe cores can be designed and created for a variety of different test devices, and when a given test device is to be tested, its corresponding probe core is installed in the system 100 using the probe frame 225 to secure a given probe core to the probe PCB 215, where the PCB 215 can have a set amount of contacts and terminals (e.g., 100 terminals) that can be reassigned for different probe cores for different chips.

Further illustrated in FIG. 2, is a positioning mechanism 230 which is an actuating mount that mechanically holds the fiber 130 to send and receive light from the test device 205, according to some example embodiments. The positioner includes a positioner mount 230A (e.g., Thorlabs MAX302 actuator) which is rigidly mounted to the probe platform 105. The positioner mount 230A holds a moveable positioner 230B which is actuated (e.g., swivel-able in six degrees of freedom) via adjustments made to positioner arm 230C. The positioning mechanism 230 is attached to a fiber mount arm 235 which holds the fiber 130. The fiber mount arm 235 can be a metal or plastic arm that is adjusted manually and then more finely using the actuating positioner mount 230A. In some example embodiments, the fiber 130 is a 0.7 to 1.04 mm fiber optic cable (e.g., TECS clad MMF with 400-800 um cores) with a plastic sleeve to provide further rigidity. According to some example embodiments, the fiber mount arm 235 include a hinge 240 with a 40-80 mm bend radius to enable the fiber to be positioned over the probe core 220 and PCB 215. For example, the hinge 240 can bend so that the end of the fiber 130 is more accurately positioned over an optical keep-out area through which light shines from the test device 205; e.g., from a light emitter that shines light through the probe core 220 into open space and into the terminating end of fiber 130 and into the optical analyzer system 125.

Figure 3:
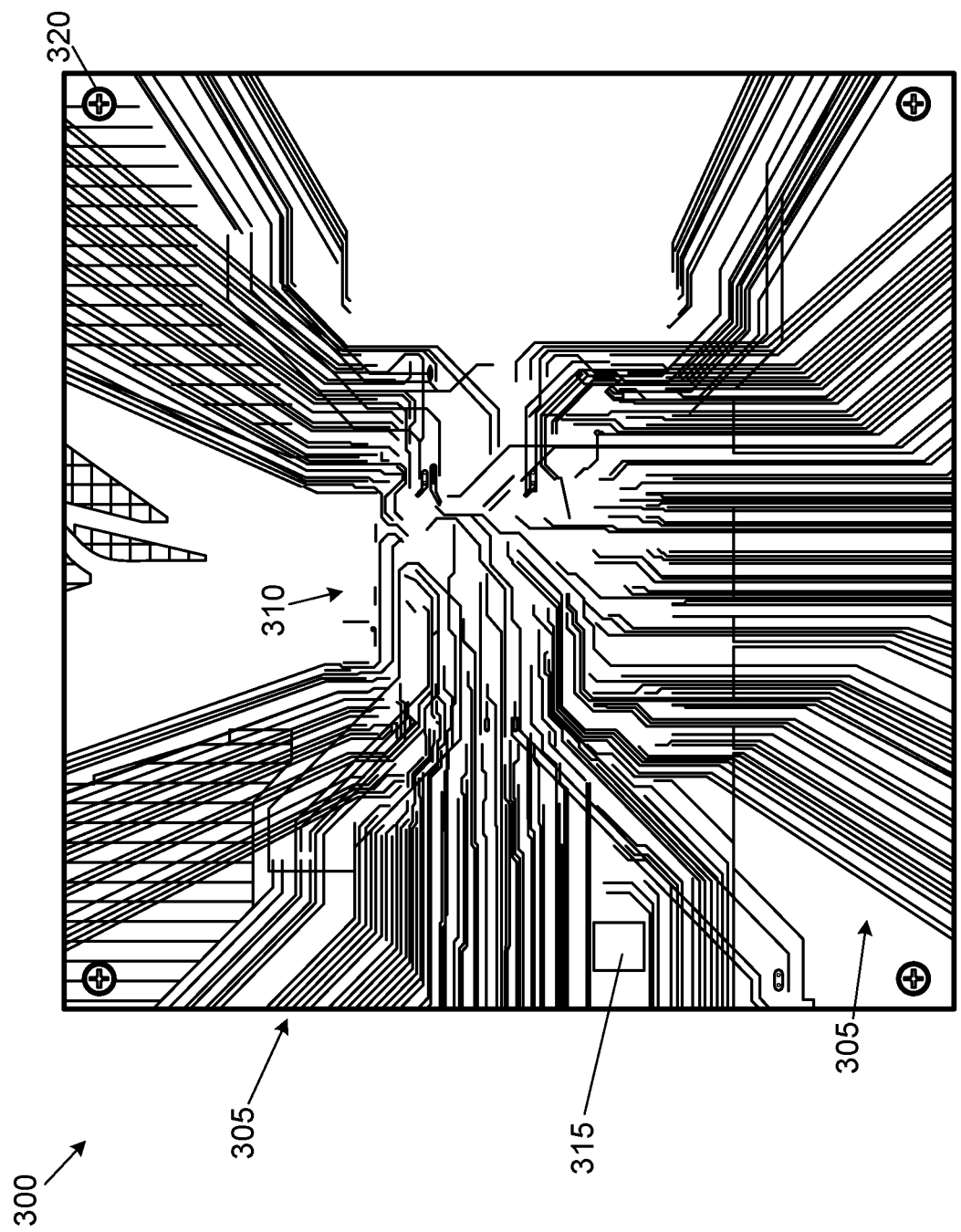
FIG. 3 shows a layout of an example membrane of a probe core, according to some example embodiments.

FIG. 3 shows a layout of a membrane 300 of a probe core 220, according to some example embodiments. The membrane 300 can be configured for different electrical layouts for different types of chips to be tested. As illustrated, the membrane 300 includes a plurality of paths 305 (e.g., metallic paths, traces) that are connected to terminals of the PCB 215 (which interfaces with electrical test systems, such as vector network analyzer 115 and circuit analyzer 117). In the example illustrated, the paths 305 end at a plurality of contacts 310 in a center area of the probe core 220, where the opposite ends of the paths 305 extend to a periphery or edge of the membrane 300 for attachment to the PCB terminals (e.g., PCB terminals 505, FIG. 5). Each of the terminals corresponds to a pin on an underside of the probe core 220, where the pins extend from the probe core 220 to corresponding contacts of the test device 205. Further, the probe core 220 includes an optical keep-out 315 (e.g., window, optical hole) that can be included in an outer region of the probe core layout design at the design stage (e.g., in layout software), such that the optical keep-out 315 can be very small and precisely placed with respect to the paths 305, where the outer region is the periphery or region outside the center region where the closely spaced plurality of contacts 310 are located. The optical keep-out 315 is devoid of the paths 305 and other obstructions so that light from the test device 205 can transmit through the probe core 220 to the fiber 130. The optical keep-out 315 is composed of the same material as the rest of membrane 300 (e.g., the optical keep-out 315 is not an empty space hole but is composed of the same substrate or insulating film material used to create the rest of the membrane 300), according to some example embodiments. In some example embodiments, to increase light transmittance, during fabrication the hole is further etched or thinned than the surrounding portions of the membrane 300. Further, as illustrated, the probe core 220 includes mount holes 320 (e.g., screw holes through the membrane and plunger) to secure the probe core 220 to the probe frame 225 using fasteners, such as screws.

Figure 4:
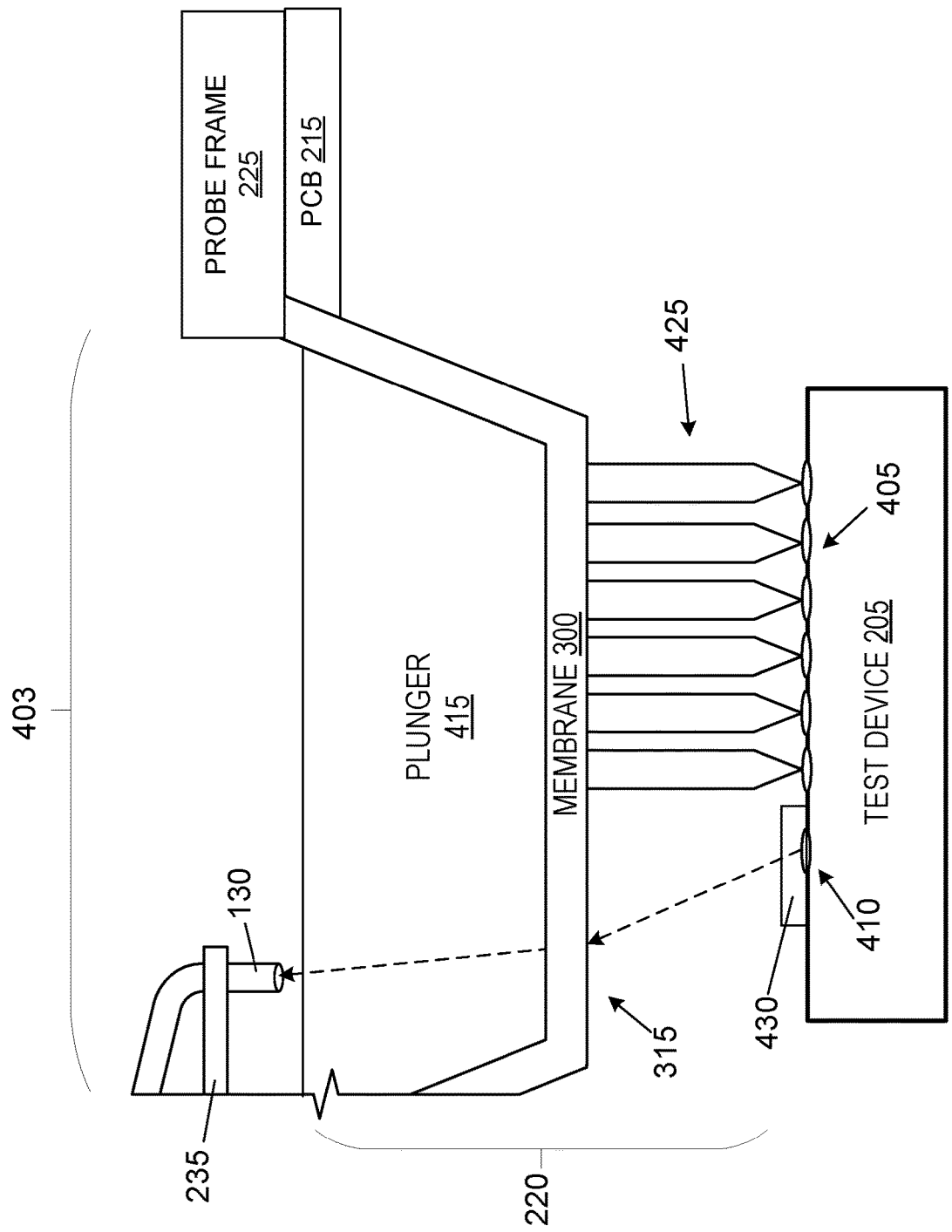
FIG. 4 shows a side view of components of the opto-electrical probe system including a probe core and test device, according to some example embodiments.

FIG. 4 shows a side view of components of the system 100 including the probe module 110 and test device 205, according to some example embodiments. The probe core 220 can be implemented as a FormFactor® pyramid probe core with a rectangular metal probe frame 225 with a rectangular hole 403 through which a plunger 415 is positioned. A membrane 300 (e.g., thin film membrane of multiple insulating sheets, polyimide film sheets) patterned with conductive traces or strips patterned on the membrane 300 is attached to the plunger 415, and the contacts 425 (e.g., bumps, pads, pins) are embedded in the membrane 300 and/or the plunger 415, and extend to touch the corresponding electrical terminals 405 (e.g., contacts) of the device under test, such as electrical I/O bumps or pads on the test device 205.

The test device 205 further includes an optical interface 410 which includes a light emitter or receiver, such as a light emitting diode, laser, or photodiode. The light emanates from the optical interface 410 and through the optical keep-out 315, where the electrical paths that connect to the contacts 425 are designed or otherwise routed (e.g., via routing design software) around the optical keep-out 315. The light is transmitted through the membrane 300 and the plunger 415 into the terminating end of the fiber 130 for testing and analysis (e.g., using optical spectrum analyzer 125). In some example embodiments, the light from the optical interface 410 is guided via an optical routing coupler 430, such as a grating. For example, the optical routing coupler 430 is integrated on the test device 205 (e.g., surface of the test device) 205 to direct the light from the light emitter towards the optical keep-out 315. In some example embodiments, the optical coupler (e.g., lens, grating) is mounted or otherwise integrated as part of the probe core, e.g., over the optical keep-out 315 to collect light emitted from the optical interface 410.

Figure 5:
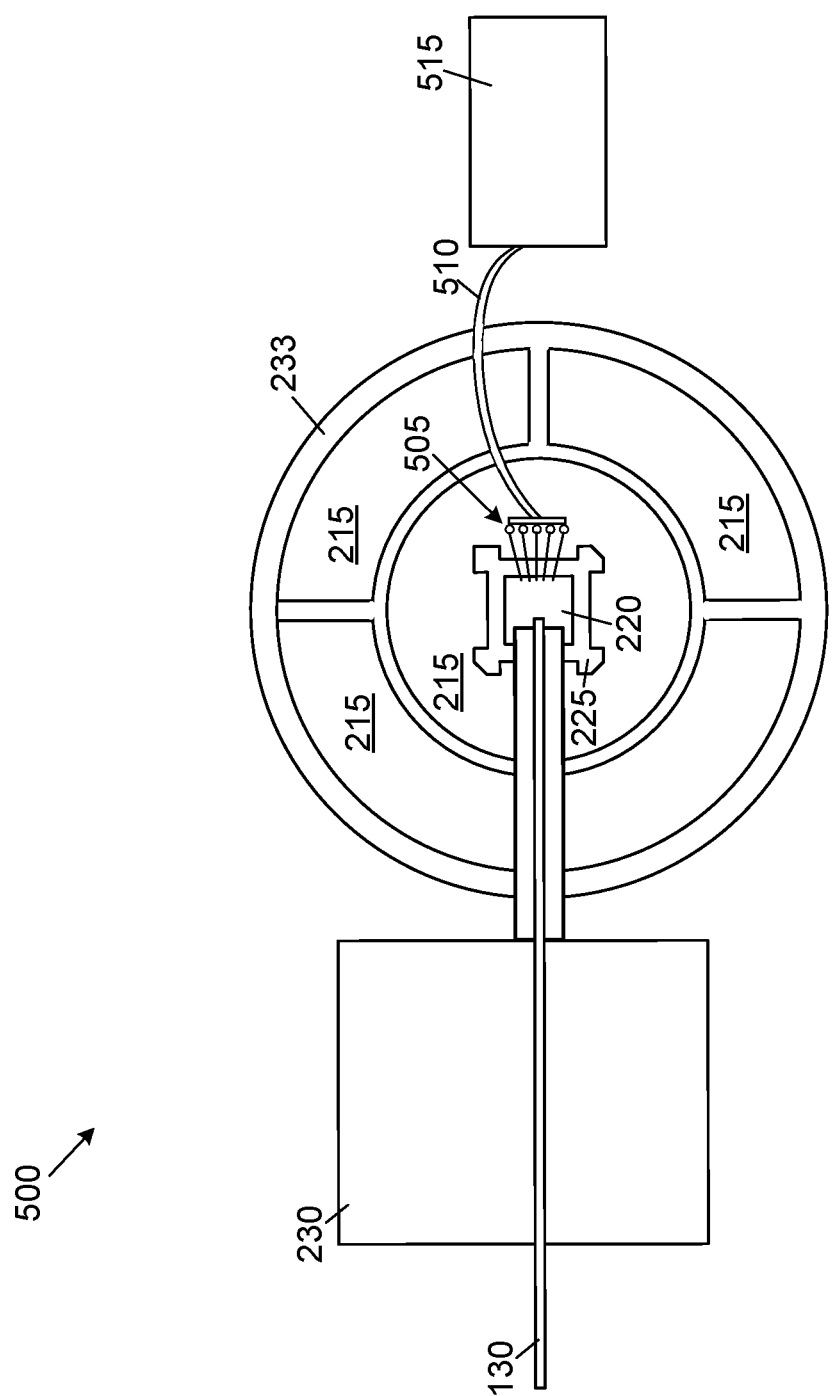
FIG. 5 shows an overhead view of the opto-electrical probe system, according to some example embodiments.

FIG. 5 shows an overhead view 500 of the system 100, according to some example embodiments. In FIG. 5, the fiber 130 (e.g., from the optical analyzer system 125) extends over the positioning mechanism 230 and positioned over the probe core 220 (e.g., optical keep-out 315) to send and receive light from the device under test (not depicted in FIG. 5). Further illustrated, is PCB stiffener 233 as a ring on the PCB 215, onto which the probe core 220 is attached via probe frame 225 (e.g., via mount hole 320, FIG. 3). The electrical paths from the probe core 220 are attached to PCB terminals 505 (e.g., PCB electrical contacts) which can be further spaced from each other than the closely spaced electrical terminals of the probe core 220. The PCB terminals 505 of the PCB are connected to cabling 510 which is electrically connected to one or more test systems 515, such as vector network analyzer 115 and circuit analyzer 117 for analysis and testing.

Figure 6:
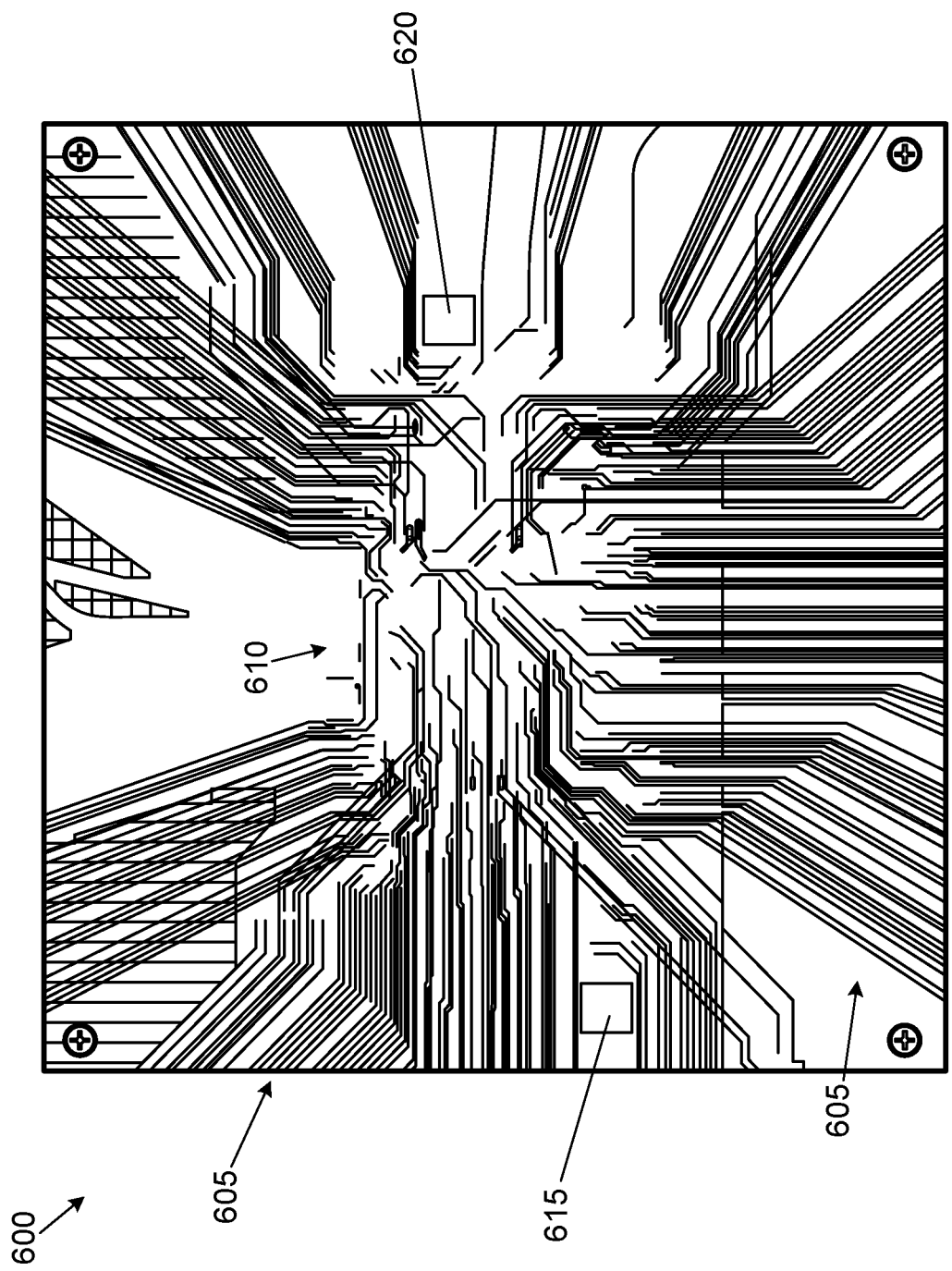
FIG. 6 shows an example layout for a membrane of a probe core in which there are multiple optical keep-outs, according to some example embodiments.

FIG. 6 shows an example layout for a membrane 600 of a probe core in which there are multiple optical holes, according to some example embodiments. In the example of FIG. 6, the electrical paths 605 connect to terminating regions 610 in the center, under which pins can connect to the device under test, which can have multiple optical interfaces. For example, a first interface of the DUT of FIG. 6 can include a transmitter (e.g., LED) and a second optical interface can include a receiver (e.g., photodiode). Alternatively, for example, the DUT of FIG. 6 may have two transmitters (e.g., two laser diodes). To enable a compact design that can be efficiently probed at the wafer level (e.g., before die singulation or separation of a wafer into individual chips), the example membrane 600 includes a first optical keep-out 615 for the first light emitter and a second optical keep-out 620 for the second light emitter.

Figure 7:
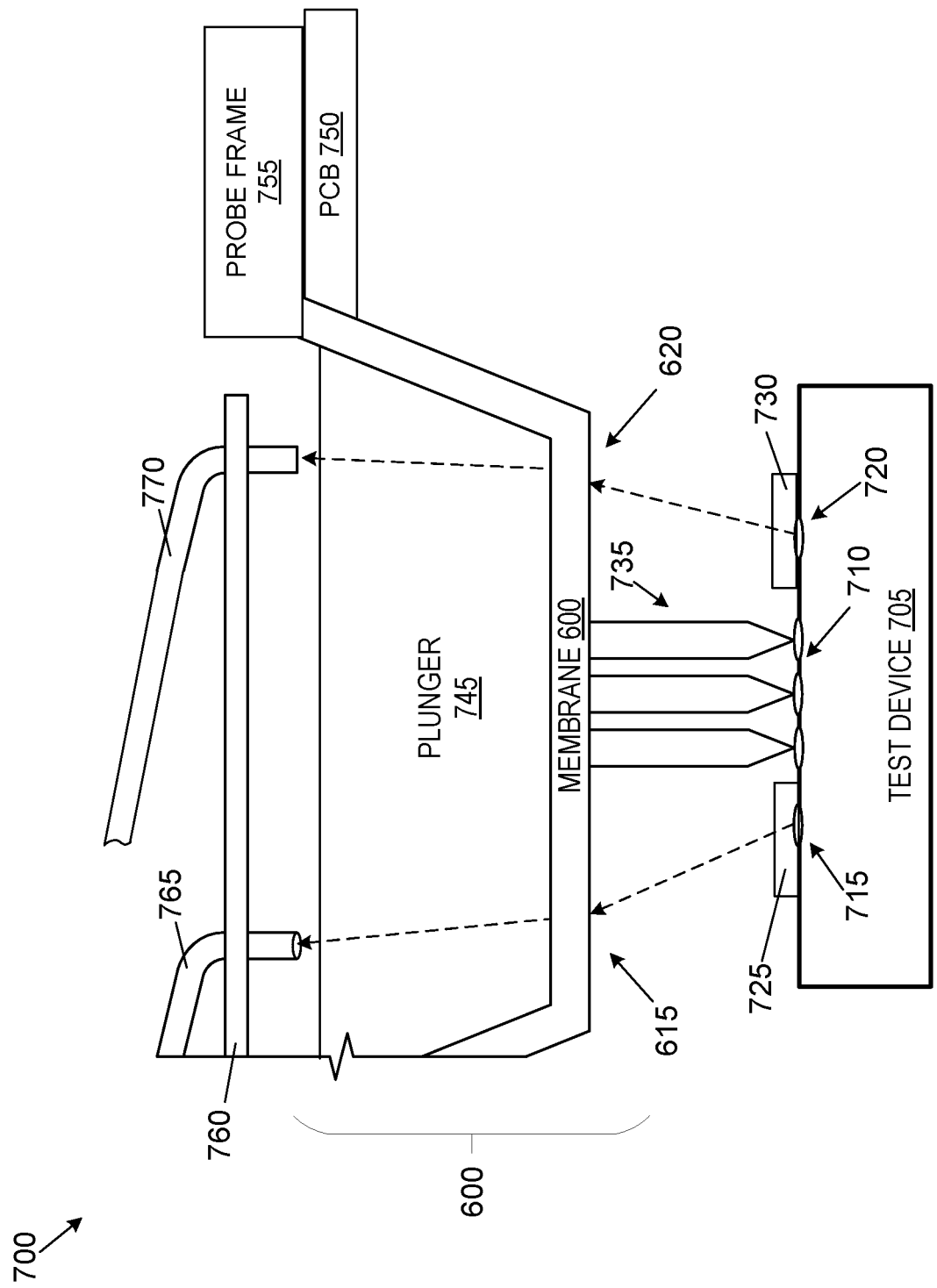
FIG. 7 shows components of the opto-electrical probe system implementing multiple optical fibers, according to some example embodiments.

FIG. 7 shows a side view 700 of components of the system 100 implementing multiple optical fibers, according to some example embodiments. As illustrated in FIG. 7, the test device 705 includes a first emitter 715 which emits light through a first coupler 725 (e.g., lens, grating) towards the first optical keep-out 615 of membrane 600, which is attached to the plunger 745 and to the PCB 750 via probe frame 755. The light is transmitted through the first optical keep-out 615 of the membrane 600 and through the plunger material to couple into a first fiber 765. Similarly, the test device 705 includes a second light emitter 720 that transmits light through a second coupler 730 (e.g., additional optical coupler, such as a lens or grating) towards the second optical keep-out 620 to a second fiber 770 via the transparent membrane 600 and plunger 745.

In the example embodiment of FIG. 7, the first fiber 765 and 770 are fixed to a dual arm 760 which holds the fibers at preset distances from one another. The dual arm 760 may be manually adjusted via one or more hinges and joints, and more finally adjusted using an actuator (e.g., ThorLabs motorized Max320 actuator mounted on the probe platform 105).

Further, according to some example embodiments, each fiber is mounted and positioned by separate arms, and separate positioners. For example, the fiber 765 may be mounted to a first arm and actuating positioner and the fiber 770 may be mounted to a second arm of another actuating positioner. In those example embodiments, the electrical contacts 735 can be aligned with contacts 710, followed by individually aligning fiber 765 using the first arm to receive a maximum amount of light from emitter 715 (e.g., in active alignment), followed by individually aligning fiber 770 using the second arm to receive the maximum amount of light from emitter 720 of the test device 705.

Figure 8:
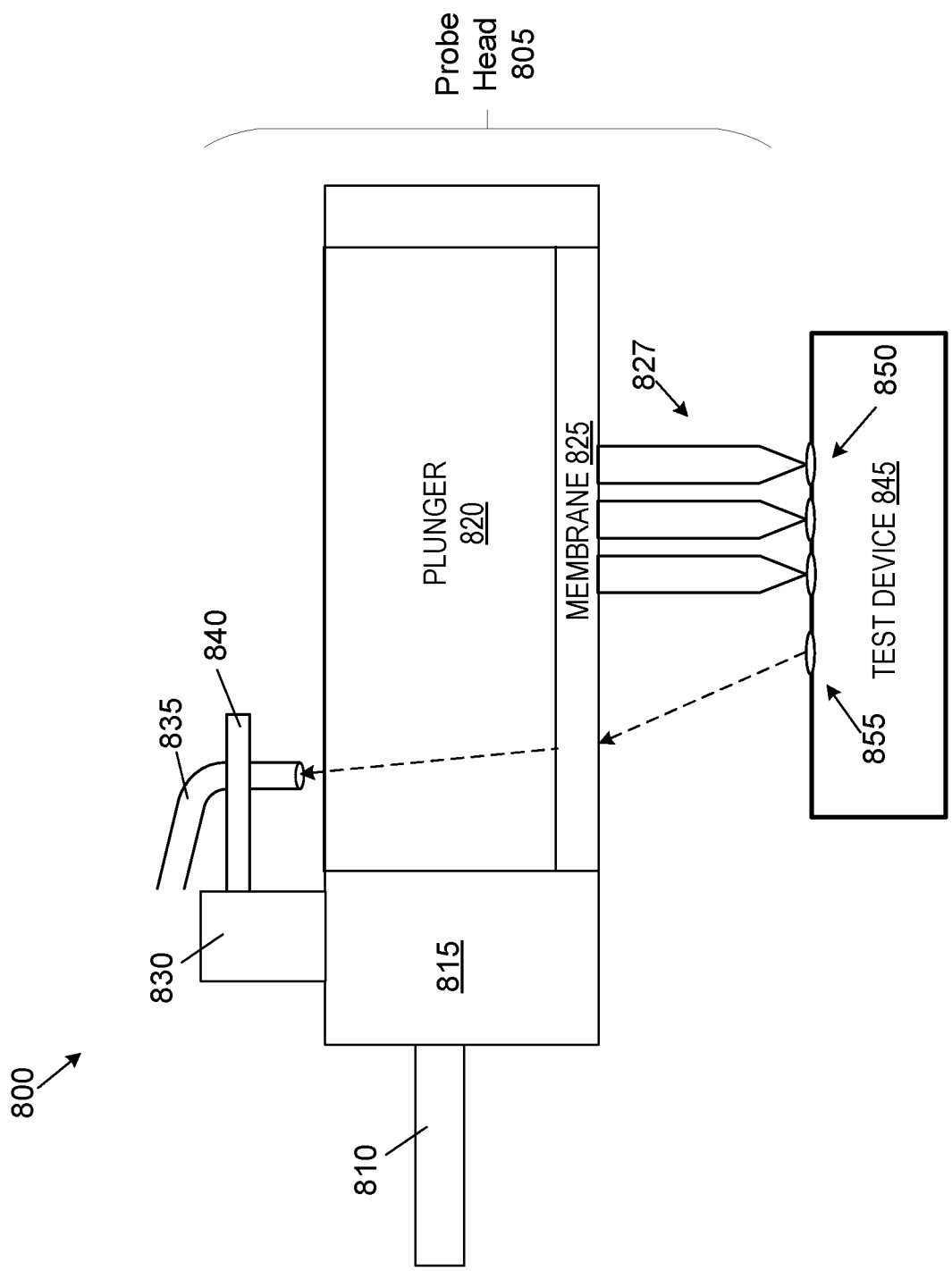
FIG. 8 shows a compact probe head, according to some example embodiments.

FIG. 8 shows a probe head 800 configuration of the compact opto-electric probe system, according to some example embodiments. In FIG. 8, the probe head includes a PCB module 815 that can include a PCB card and stiffener that is attached to a plunger 820 and membrane 825 having pins and an optical keep-out as discussed above. The probe head 805 is positionable via a probe head arm 810 which can be positioned by hand or an actuator (e.g., a Thor Labs actuator, not depicted in FIG. 8), according to some example embodiments. After positioning the probe head 805 such that the pins 827 are coupled to respective contacts 850 of the device under test 845, a fiber positioner 830 (e.g., an actuator mounted on PCB module 815) positions a fiber 835 mounted to the fiber actuator arm 840 to more finely align light refracting through the membrane 825 and plunger 820 from the light emitter 855 of the test device 845, according to some example embodiments. Although in the example of FIG. 8, only a single fiber coupler is implemented, in other example embodiments additional fibers are implemented (e.g., two fibers attached at a preset distance to fiber arm 840, two fibers each having their own fiber actuator mounted on PCB module 815).

Figure 9:
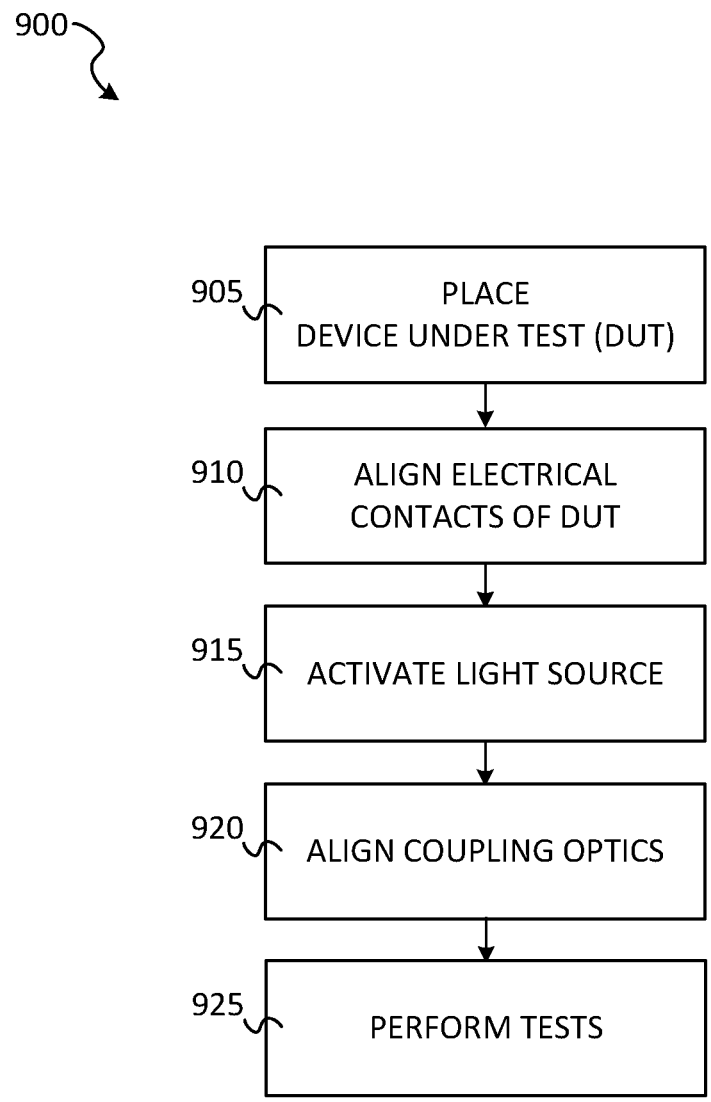
FIG. 9 shows a flow diagram of a method for testing an opto-electric device at the wafer level using a compact opto-electric probe, according to some example embodiments.

FIG. 9 shows a flow diagram of a method 900 for efficiently analyzing an opto-electric test device (e.g., wafer component, singulated chip) using a compact opto-electric probe, according to some example embodiments. At operation 905, the device under test (e.g., wafer, chip) is placed on a probe platform of the compact opto-electric probe system. At operation 910, the electrical contacts of the device under test are aligned. For example, at operation 910, a probe core of the compact opto-electric probe is positioned over the device under test such that each of the probe core electrical contacts (e.g., pins) electrically connects to a corresponding pin of the device under test. In some example embodiments, the device under test is a die of a plurality of dies on a wafer, and the probe head interfaces with the individual die while on the wafer. In other example embodiments, the device under test is a PIC chip that has been separated from a wafer, and during operation 910 the electrical contacts of the PIC chip and the electrical terminals of the probe are electrically connected.

At operation 915, the light source of the device under test is activated. For example, at operation 915 an optical emitter (e.g., LED, laser) of the device under test is activated to emit light into open space or an optical coupler that directs the light towards the probe core.

At operation 920, the coupling optics are aligned. For example, the light emitter of the device under test shines light up towards an optical keep-out area (e.g., optical hole, window) in the probe core that is devoid of optical traces or other obstructing objects (e.g., pins, pads, screws, resistors). The light refracts through the membrane and refracts further through the plunger and emanates into free space towards the terminating end of the coupler. The actuating positioner then physically moves the fiber so that it receives a sufficient amount of light from the device under test to perform optical analysis (e.g., a maximum amount of light per position near the optical keep-out, or a sufficient amount of light to receive light and optical data from the device under test). At operation 925, the device under test undergoes testing and analysis using the optically and electrically connected compact opto-electric probe, e.g., using optical analyzer system 125, vector network analyzer 115, circuit analyzer 117). Additionally, as discussed, after analysis, the probe head is moved to another portion of the wafer to test another chip that has not yet been singulated. In this way, the probe head can more quickly test multiple components (e.g., dies) on the wafer before singulation, or after singulation in the case of an individual PIC chip.

In some example embodiments, one or more operations of the method 900 may be modified or omitted for multiple emitter DUTs or passive alignment testing. For example, if the device under test includes multiple light emitters (e.g., two lasers), operations 915 and 920 may be implemented first for the first light emitter and then again for a second light emitter, where the two light emitters are on different actuating positioners. Alternatively, if a single arm holds both fibers at a pre-configured distance (e.g., FIG. 7), then both emitters are activated at operation 920, and the alignment of operation 920 involves using a single actuating positioner to move the arm to align both fibers to receive sufficient light from respective emitters of the device under test.

Alternatively, in a passive approach, operations 915 and 920 are omitted and only the electrical alignment of operation 910 occurs. For example, if the device under test can operation with optical losses, the electrical interfaces are aligned at operation 910 and it is assumed that the fiber is located proximate to the optical keep-out window of the probe core and that in further testing a sufficient amount of light will reach the fiber, without actuating the fiber with respect to the probe core window. The passive approach can be implemented, for example, where fabrication of the device under test is very precise or where the amount of emitted light from the emitter that needs to reach the fiber to conduct analysis is proportionally low (e.g., high loss design, or a very bright emitter).

The following are example embodiments:

Example 1. An opto-electrical probe for interfacing with an opto-electrical device, the opto-electrical probe comprising: an electrical layer having electrical paths, at least some of the electrical paths being connected to electrical terminals configured to interface with electrical components of the opto-electrical device, the electrical paths avoiding a light path formed in the electrical layer; and an optical interface to interface with an optical component of the opto-electrical device, the optical interface arranged to optically communicate with the optical component through the light path formed in electrical layer.

Example 2. The opto-electrical probe of example 1, comprising a flexible optical fiber to allow positioning of the opto-electrical probe into an operative position in which the electrical terminals are in electrical contact with electrical contacts of the opto-electrical device and the optical interface is optically aligned with the optical component.

Example 3. The opto-electrical probe of any of examples 1 or 2 1, wherein the electrical layer comprises a membrane that includes the electrical paths, and wherein the electrical terminals extend from the membrane to corresponding electrical contacts of the opto-electric device.

Example 4. The opto-electrical probe of any of examples 1 to 3, wherein material that forms the membrane transmits light, the light path being an optical hole composed of the material of the membrane, the electrical paths positioned around the optical hole.

Example 5. The opto-electrical probe of any of examples 1 to 4, wherein the optical hole is formed by a layout design of the electrical paths.

Example 6. The opto-electrical probe of any of examples 1 to 5, wherein the electrical paths extend from a periphery of the membrane to the electrical terminals in a center region of the membrane.

Example 7. The opto-electrical probe of any of examples 1-6, wherein the optical hole is positioned in an outer region of the membrane that is outside the center region that includes the electrical terminals.

Example 8. The opto-electrical probe of any of examples 1-8, wherein the membrane is disposed on a plunger that is transparent or semitransparent, the plunger extending from a printed-circuit board (PCB) toward the opto-electrical device.

Example 9. The opto-electrical probe of any of examples 1 to 8, wherein the membrane and the plunger are attached to the PCB using fasteners.

Example 10. The opto-electrical probe of any of examples 1 to 9, wherein the PCB comprises PCB electrical contacts that connect to periphery terminals of the membrane, the periphery terminals being ends of the electrical paths opposite of other ends of the electrical paths that terminate in a center of the membrane.

Example 11. The opto-electrical probe of any of examples 1 to 10, wherein one or more electrical test apparatuses are electrically connected to the PCB electrical contacts.

Example 12. The opto-electrical probe of any of examples 1 to 11, wherein the flexible optical fiber is coupled to an optical test apparatus.

Example 13. The opto-electrical probe of any of examples 1 to 12, wherein the flexible optical fiber is positioned by a positioning mechanism.

Example 14. The opto-electrical probe of any of examples 1 to 13, wherein the positioning mechanism is an actuator.

Example 15. The opto-electrical probe of any of examples 1 to 14, wherein the opto-electrical device is a wafer comprising a plurality of opto-electrical dies.

Example 16. The opto-electrical probe of any of examples 1 to 15, wherein the electrical components and the optical component are in one of the plurality of opto-electrical dies, the opto-electrical probe configured to interface with the one of the plurality of opto-electrical dies in the wafer.

Example 17. A test apparatus to test a photonic integrated circuit (PIC), the test apparatus comprising: a support arrangement to support the PIC; a test probe including an electrical layer and an optical interface, the test probe comprising: an electrical layer having electrical paths, at least some of the electrical paths being connected to electrical terminals configured to interface with electrical components of the PIC, the electrical paths avoiding a light path formed in the electrical layer; and an optical interface to interface with an optical component of the PIC, the optical interface arranged to optically communicate with the optical component through the light path formed in electrical layer; and a positioning mechanism to selectively move the test probe into an operative position in which the electrical terminals are in electrical contact with electrical contacts of the PIC and the optical interface is optically aligned with the optical component.

Example 18. The test apparatus of example 17, comprising a flexible optical fiber to allow positioning of the test probe into the operative position in which the electrical terminals are in electrical contact with electrical contacts of the PIC and the optical interface is optically aligned with the optical component.

Example 19. The test apparatus of any of examples 17 or 18, wherein the PIC is a PIC chip singulated from a wafer comprising a plurality of PIC chips.

Example 20. A method of testing an opto-electrical device, the method comprising: positioning an opto-electrical probe of a test apparatus into an operative position wherein electrical terminals of an electrical layer having electrical paths are connected to electrical terminals that interface with electrical components of the opto-electrical device, the electrical paths avoiding a light path formed in the electrical layer, and wherein an optical interface interfaces with an optical component of the opto-electrical device through the light path; and performing an electrical test on the electrical components and performing an optical test via the optical interface on the opto-electrical device via the optical interface.

While various embodiments have been described above, it should be understood that they have been presented by way of example only, and not limitation. Where methods described above indicate certain events occurring in certain order, the ordering of certain events may be modified. Additionally, certain of the events may be performed concurrently in a parallel process when possible, as well as performed sequentially as described above. Accordingly, the specification is intended to embrace all such modifications and variations of the disclosed embodiments that fall within the spirit and scope of the appended claims.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. An opto-electrical probe for interfacing with an optical transmitter photonic integrated circuit (PIC), the opto-electrical probe comprising:
    an electrical layer having electrical paths in a membrane, the membrane being disposed on a plunger that is semitransparent or transparent, the plunger extending from a printed-circuit board (PCB) toward the optical transmitter PIC, at least some of the electrical paths being connected to electrical terminals configured to interface with electrical components of the optical transmitter PIC, the electrical paths avoiding a vertical light path that extends from a bottom side of the membrane to a top side of the membrane that is opposite of the bottom side;
    an optical fiber arranged to receive light that is generated by an integrated light source of the optical transmitter PIC such that the light propagates from an optical output port of the optical transmitter PIC and refracts through material of the membrane along the vertical light path to the optical fiber; and
    an optical fiber mount to adjust the optical fiber over the top side of the membrane such that the light propagating along the vertical light path from the bottom side of the membrane to the top side of the membrane and into the optical fiber is increased.

2. The opto-electrical probe of claim 1, wherein the optical fiber is flexible to allow positioning, by the optical fiber mount, of the optical fiber to a position in which the electrical terminals remain in electrical contact with electrical contacts of the optical transmitter PIC and the light refracting through the membrane to the optical fiber is increased.

3. The opto-electrical probe of claim 2, wherein the optical fiber is optically coupled to an optical test apparatus to measure the light generated by the integrated light source of the optical transmitter PIC.

4. The opto-electrical probe of claim 2, wherein the opto-electrical probe further comprises a positioning mechanism that moves the optical fiber mount to adjust the optical fiber to receive an increased amount of light that is generated by the integrated light source and propagates through the membrane towards the optical fiber.

5. The opto-electrical probe of claim 4, wherein the positioning mechanism is an actuator.

6. The opto-electrical probe of claim 1, wherein the electrical terminals extend from the membrane to corresponding electrical contacts of the optical transmitter PIC.

7. The opto-electrical probe of claim 1, wherein the light from the integrated light source propagates from the optical transmitter PIC into a first side of the membrane and exits from a second side of the membrane towards the optical fiber.

8. The opto-electrical probe of claim 7, wherein the vertical light path is formed by a layout design of the electrical paths.

9. The opto-electrical probe of claim 8, wherein the electrical paths extend from a periphery of the membrane to the electrical terminals in a center region of the membrane.

10. The opto-electrical probe of claim 9, wherein the vertical light path is positioned in an outer region of the membrane that is outside the center region that includes the electrical terminals.

11. The opto-electrical probe of claim 1, wherein the light propagates from the optical output port to the membrane via a lens.

12. The opto-electrical probe of claim 1, wherein the membrane and the plunger are attached to the PCB using fasteners.

13. The opto-electrical probe of claim 12, wherein the PCB comprises PCB electrical contacts that connect to periphery terminals of the membrane, the periphery terminals being ends of the electrical paths opposite of other ends of the electrical paths that terminate in a center of the membrane.

14. The opto-electrical probe of claim 13, wherein one or more electrical test apparatuses are electrically connected to the PCB electrical contacts.

15. The opto-electrical probe of claim 1, wherein a wafer comprises the optical transmitter PIC and the opto-electrical probe interfaces electrically and optically with the optical transmitter PIC in the wafer.

16. The opto-electrical probe of claim 15, wherein the optical output port is a grating to output light generated from the optical transmitter PIC.

17. A test apparatus to test an optical transmitter photonic integrated circuit (PIC), the test apparatus comprising:
    a support arrangement to support the optical transmitter PIC;
    a test probe including an electrical layer and an optical fiber on an optical fiber mount, the electrical layer having electrical paths in a membrane, the membrane being disposed on a plunger that is semitransparent or transparent, the plunger extending from a printed-circuit board (PCB) toward the optical transmitter PIC, at least some of the electrical paths being connected to electrical terminals configured to interface with electrical components of the optical transmitter PIC, the electrical paths avoiding a vertical light path that extends from a bottom side of the membrane to a top side of the membrane that is opposite of the bottom side, the optical fiber arranged in the optical fiber mount to receive light that is generated by an integrated light source of the optical transmitter PIC such that light propagates from an optical output port of the optical transmitter PIC and refracts through material of the membrane along the vertical light path to the optical fiber; and a positioning mechanism to move the optical fiber mount to adjust the optical fiber over the top side of the membrane such that the light propagating along the vertical light path from the bottom side of the membrane to the top side of the membrane and into the optical fiber is increased.

18. The test apparatus of claim 17, wherein the optical output port is a grating to output light generated from the optical transmitter PIC.

19. The test apparatus of claim 17, wherein the optical fiber is optically coupled to an optical test apparatus to measure the light generated by the integrated light source that refracts through the membrane.

20. A method of testing an optical transmitter photonic integrated circuit (PIC), the method comprising:
positioning an opto-electrical probe of a test apparatus into an operative position wherein electrical terminals of an electrical layer having electrical paths in a membrane are connected to electrical terminals that electrically interface with electrical components of the optical transmitter PIC, the membrane being disposed on a plunger that is semitransparent or transparent, the plunger extending from a printed-circuit board (PCB) toward the optical transmitter PIC, the electrical paths avoiding a vertical light path that extends from a bottom side of the membrane to a top side of the membrane that is opposite of the bottom side, and wherein an optical fiber attached to an optical fiber mount is arranged to receive light that is generated by an integrated light source of the optical transmitter PIC such that the light propagates from an optical output port of the optical transmitter PIC and refracts through material of the membrane along the vertical light path to optical fiber;
moving the optical fiber mount using a positioning mechanism to position the optical fiber such that the light propagating along the vertical light path from the bottom side of the membrane to the top side of the membrane and into the optical fiber is increased; and
performing, using the opto-electrical probe, an electrical test while performing an optical test on the optical transmitter PIC, the electrical components being tested using the electrical terminals of the opto-electrical probe while optical components of the optical transmitter PIC are tested using the optical fiber and the optical output port.

* * * * *